(12) United States Patent
Biloiu et al.

(10) Patent No.: US 12,191,117 B2
(45) Date of Patent: Jan. 7, 2025

(54) COMPACT LOW ANGLE ION BEAM EXTRACTION ASSEMBLY AND PROCESSING APPARATUS

(71) Applicant: Applied Materials, Inc., Santa Clara, CA (US)

(72) Inventors: Costel Biloiu, Rockport, MA (US); Jay R. Wallace, Danvers, MA (US); Solomon Belangedi Basame, Middleton, MA (US); Kevin R. Anglin, Somerville, MA (US); Tyler Rockwell, Wakefield, MA (US)

(73) Assignee: Applied Materials, Inc., Santa Clara, CA (US)

( * ) Notice: Subject to any disclaimer, the term of this patent is extended or adjusted under 35 U.S.C. 154(b) by 500 days.

(21) Appl. No.: 17/503,334

(22) Filed: Oct. 17, 2021

(65) Prior Publication Data
US 2023/0124509 A1   Apr. 20, 2023

Related U.S. Application Data

(63) Continuation-in-part of application No. 17/502,777, filed on Oct. 15, 2021, now abandoned.

(51) Int. Cl.
*H01J 37/32* (2006.01)

(52) U.S. Cl.
CPC .. *H01J 37/32412* (2013.01); *H01J 37/32357* (2013.01); *H01J 37/32422* (2013.01)

(58) Field of Classification Search
None
See application file for complete search history.

(56) References Cited

U.S. PATENT DOCUMENTS

| | | |
|---|---|---|
| 9,620,335 B2 | 4/2017 | Biloiu et al. |
| 11,056,319 B2 | 7/2021 | Biloiu et al. |
| 2009/0266997 A1 | 10/2009 | Tieger |

(Continued)

FOREIGN PATENT DOCUMENTS

| | | |
|---|---|---|
| JP | 2020107559 A | 7/2020 |
| TW | 202105456 A | 2/2021 |

OTHER PUBLICATIONS

NPL search history.*

(Continued)

*Primary Examiner* — Eliza W Osenbaugh-Stewart
(74) *Attorney, Agent, or Firm* — KDW FIRM PLLC

(57) ABSTRACT

An extraction assembly may include an extraction plate for placement along a side of a plasma chamber, and having an extraction aperture, elongated along a first direction, and having an aperture height, extending along a second direction, perpendicular to the first direction. The extraction plate defines an inner surface along the extraction aperture, lying in a first plane. A beam blocker is disposed over the extraction aperture, and has an outer surface, disposed in a second plane, different than the first plane. As such, the beam blocker overlaps with the extraction plate along a first edge of the extraction aperture by a first overlap distance, and overlaps with the extraction plate along a second edge of the extraction aperture by a second overlap distance, so as to define a first extraction slit, along the first edge, and a second extraction slit along the second edge.

16 Claims, 10 Drawing Sheets

(56) References Cited

U.S. PATENT DOCUMENTS

| | | | |
|---|---|---|---|
| 2016/0013030 A1* | 1/2016 | Venugopal | H01J 37/32623 |
| | | | 156/345.1 |
| 2017/0178866 A1 | 6/2017 | Radovanov | |
| 2018/0076007 A1* | 3/2018 | Gilchrist | H01J 37/32422 |
| 2018/0138008 A1 | 5/2018 | Hahto | |
| 2019/0371580 A1* | 12/2019 | McGillicudy | H01J 37/08 |
| 2020/0098540 A1 | 3/2020 | Biloiu | |
| 2020/0194219 A1 | 6/2020 | Heres | |
| 2022/0174810 A1 | 6/2022 | Biloiu et al. | |

OTHER PUBLICATIONS

International Search Report and Written Opinion for the International Patent Application No. PCT/US2022/041682, mailed Dec. 22, 2022, 7 pages.

\* cited by examiner

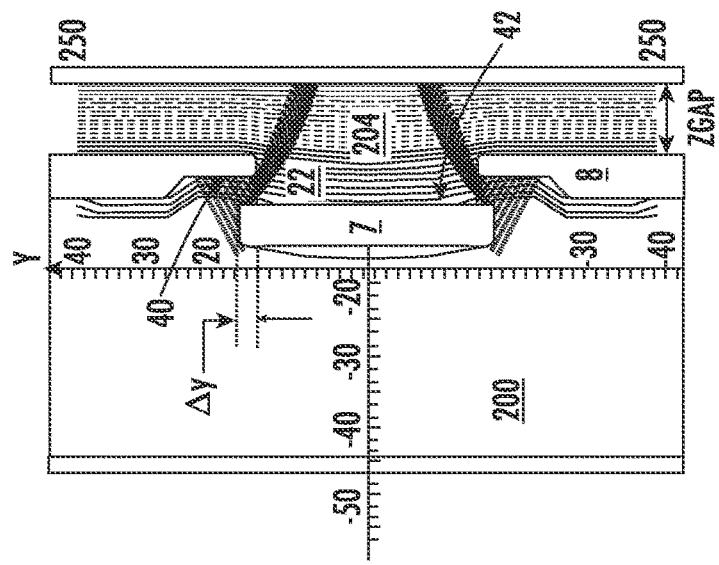
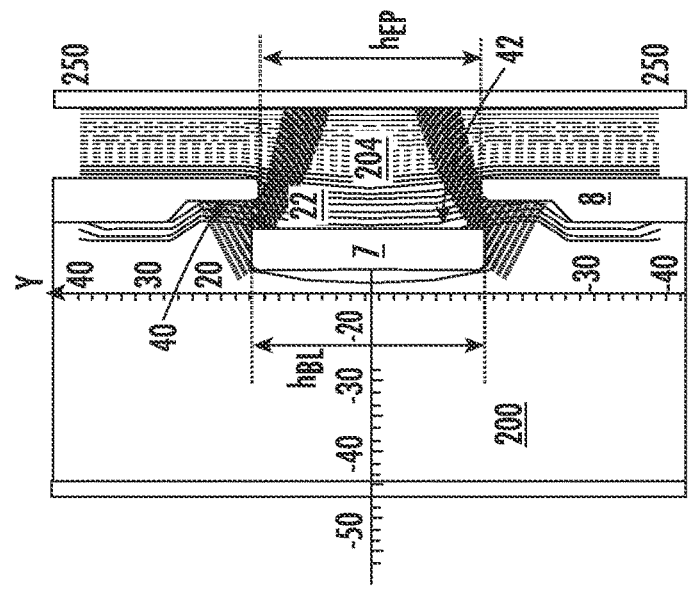
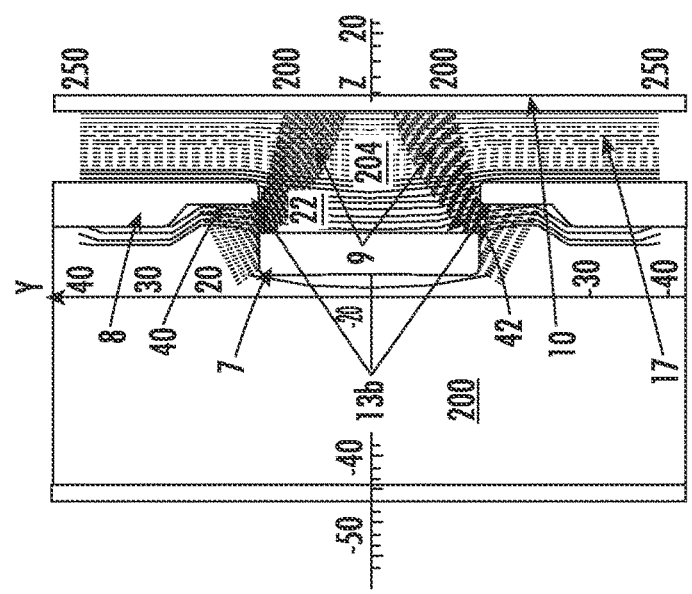
FIG. 2A
FIG. 2B
FIG. 2C

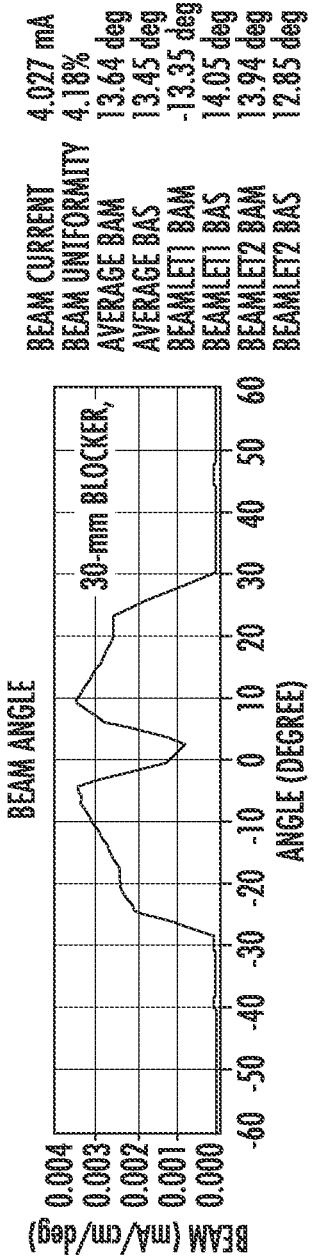
FIG. 3C
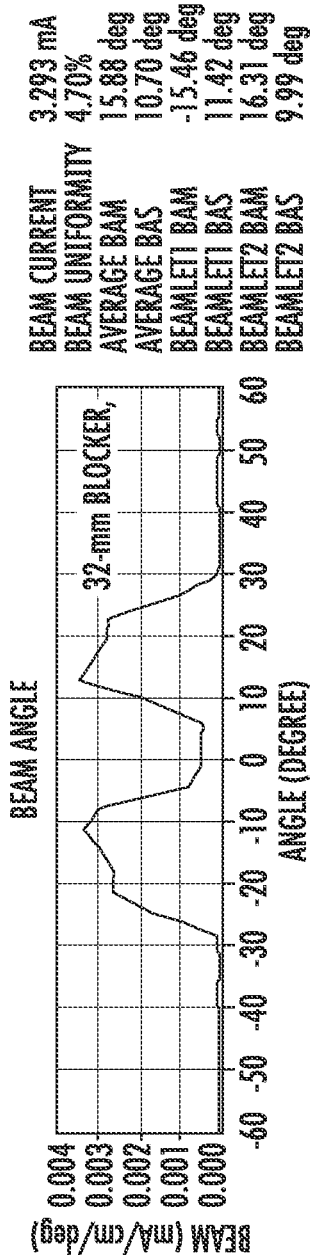
FIG. 3D
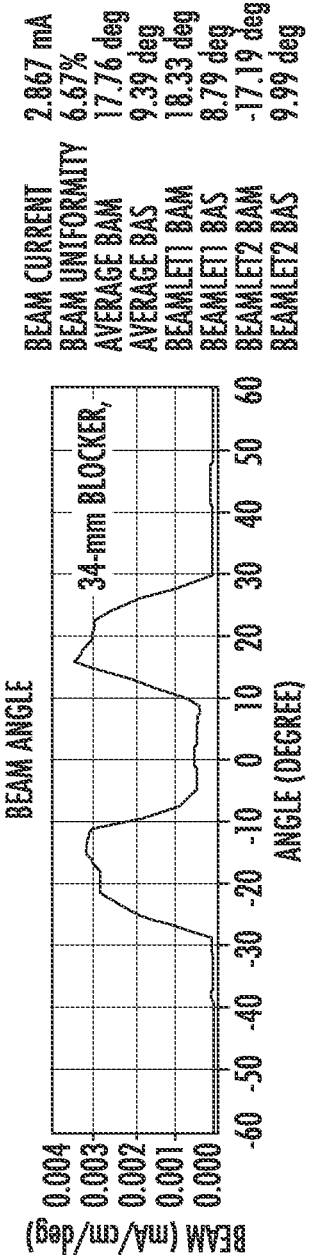
FIG. 3E
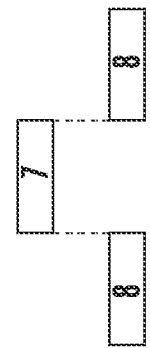
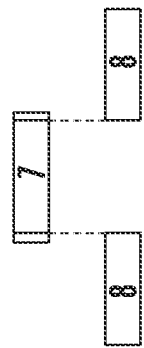
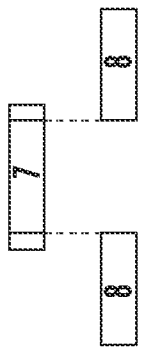

COMPACT LOW ANGLE ION BEAM EXTRACTION ASSEMBLY AND PROCESSING APPARATUS

CROSS-REFERENCE TO RELATED APPLICATION

This application is a continuation-in-part of and claims priority to U.S. Non-Provisional application Ser. No. 17/502,777, filed on Oct. 15, 2021, entitled "COMPACT LOW ANGLE ION BEAM EXTRACTION ASSEMBLY AND PROCESSING APPARATUS", and incorporated by reference herein in its entirety.

FIELD

The present embodiments relate to a plasma processing apparatus, and more particularly, low angle ion beam extraction optics.

BACKGROUND

Conventional apparatuses used to treat substrates with ions include beamline ion implanters and plasma immersion ion implantation tools. Both are appropriate for implanting ions over a range of energies. In beamline ion implanters, ions are extracted from a source, mass analyzed, and then transported to the substrate surface. In a plasma immersion ion implantation apparatus, a substrate is located in the same chamber and the plasma is generated adjacent to the plasma. The substrate is set at negative potential with respect to the plasma and ions that cross the plasma sheath in front of the substrate impinge on the substrate at zero incidence angle with respect to the normal or perpendicular to the main plane of the substrate. Recently a new processing apparatus has been developed providing angled ion beams for substrate processing in a compact configuration. Ions are extracted through an aperture of special geometry located in an extraction plate that is placed proximate a plasma. The ions are extracted in a manner that provides angles of incidence that are not normal to the main plane of the substrate. Such apparatus facilitate treatment of non-planar surfaces, such as for treatment of structures having sidewalls extending along the normal to the main plane.

One type of compact angled ion beam apparatus employs an extraction aperture adjacent a plasma chamber in order to extract an ion beam from the plasma contained in the plasma chamber. In order to process device structures uniformly, a beam blocker component may be arranged in the middle of the extraction aperture, which component creates a pair of angled ion beamlets directed at opposite angles to a substrate (symmetric relative to normal on the main plane of the substrate), so that opposing surfaces of device structures, such as opposing sidewalls of a trench may be exposed in a single treatment.

Often, the extraction aperture has an elongated shape so a pair of ribbon ion beams having heights of perhaps a few millimeters to a few centimeters and widths of up to several hundred mm are extracted. In the case the ion beams are wider than the substrate to be processed (a 300 mm Si wafer for instance) an entirety of a substrate may be exposed to the two symmetric ion beamlets by scanning the substrate in front of the extraction aperture in a direction perpendicular to the elongation direction of the extraction aperture.

While the presence of the beam blocker facilitates creation of angled ion beams, the beam current extracted through the extraction aperture is reduced by the presence of the beam blocker. This reduction of beam current may be addressed by providing multiple extraction apertures along the side of a plasma chamber to generate multiple pairs of symmetric ion beamlets simultaneously. However, when the plasma is not uniform within a plasma chamber, the ion beams extracted from different extraction apertures located at different positions along the plasma chamber may differ from one another. Thus, different regions of a substrate, exposed to different extraction apertures may be treated with different ion beams having different characteristics, such as different angles of incidence.

Another issue for processing substrates using angled ions is the control of angle of incidence. While angled ion beams may be characterized by a mean angle, the angled ion beams are produced with a distribution of angles of incidence, sometimes termed an "angular spread." In some applications, the processing of substrates over a relatively wider angular spread is acceptable. In other applications, a relatively narrow angular spread may be called for, including for relatively low average angle of incidence. In the present day, extraction apparatus to fulfill the above requirements are lacking. It is with respect to these and other considerations that the present disclosure is provided.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, an extraction assembly is provided, comprising an extraction plate for placement along a side of a plasma chamber, and having an extraction aperture, elongated along a first direction, having an aperture height, extending along a second direction, perpendicular to the first direction. The extraction plate defines an inner surface along the extraction aperture, lying in a first plane. A beam blocker is disposed over the extraction aperture, and having an outer surface, disposed in a second plane, different than the first plane, toward an inner side of the extraction plate. As such, the beam blocker overlaps with the extraction plate along a first edge of the extraction aperture by a first overlap distance, and overlaps with the extraction plate along a second edge of the extraction aperture by a second overlap distance, so as to define a first extraction slit, along the first edge, and a second extraction slit along the second edge.

In another embodiment, a processing apparatus may include: a plasma chamber to house a plasma; and an extraction plate arranged along a side of a plasma chamber, the extraction plate having an extraction aperture, elongated along a first direction, and having an extraction aperture height, extending along a second direction, perpendicular to the first direction. The extraction plate may define an inner surface along the extraction aperture, lying in a first plane. The processing apparatus may further include a beam blocker, disposed over the extraction aperture, and having an outer surface, disposed in a second plane, different than the first plane, toward an inner side of the extraction plate. As such, the beam blocker may overlap with the extraction plate along a first edge of the extraction aperture by a first overlap distance, and overlap with the extraction plate along a second edge of the extraction aperture by a second overlap distance, so as to define a first extraction slit, along the first edge, and a second extraction slit along the second edge.

In a further embodiment, a compact angled ion beam apparatus, comprising: a plasma chamber to house a plasma; and an extraction assembly, disposed adjacent to the plasma chamber, and comprising: an extraction plate arranged along a side of a plasma chamber. The extraction plate may include an extraction aperture, elongated along a first direction, and having an aperture height, extending along a second direction, perpendicular to the first direction, where the extraction plate defines an inner surface along the extraction aperture, lying in a first plane. The apparatus may include a beam blocker, disposed over the extraction aperture, and having an outer surface, disposed in a second plane, different than the first plane, toward an inner side of the extraction plate. The apparatus may further include a coupling assembly, reversibly connecting the beam blocker to the extraction plate, wherein the coupling assembly is configured to adjust an overlap distance between the extraction plate and the beam blocker along the second direction, and to adjust a slit width of the extraction assembly, the slit width comprising a distance between the extraction plate and beam blocker along a third direction, perpendicular to the first plane and the second plane.

BRIEF DESCRIPTION OF THE DRAWINGS

FIGS. 2A-2C present simulations of electrostatic equipotential lines and ion trajectories for three different variants of embodiments of the disclosure;

FIG. 3C, FIG. 3D and FIG. 3E depict the results of current measurement as a function of beam angle for different values of overlap between beam blocker and extraction plate, according to different embodiments of the disclosure;

DETAILED DESCRIPTION

Figures 1A, 1B:
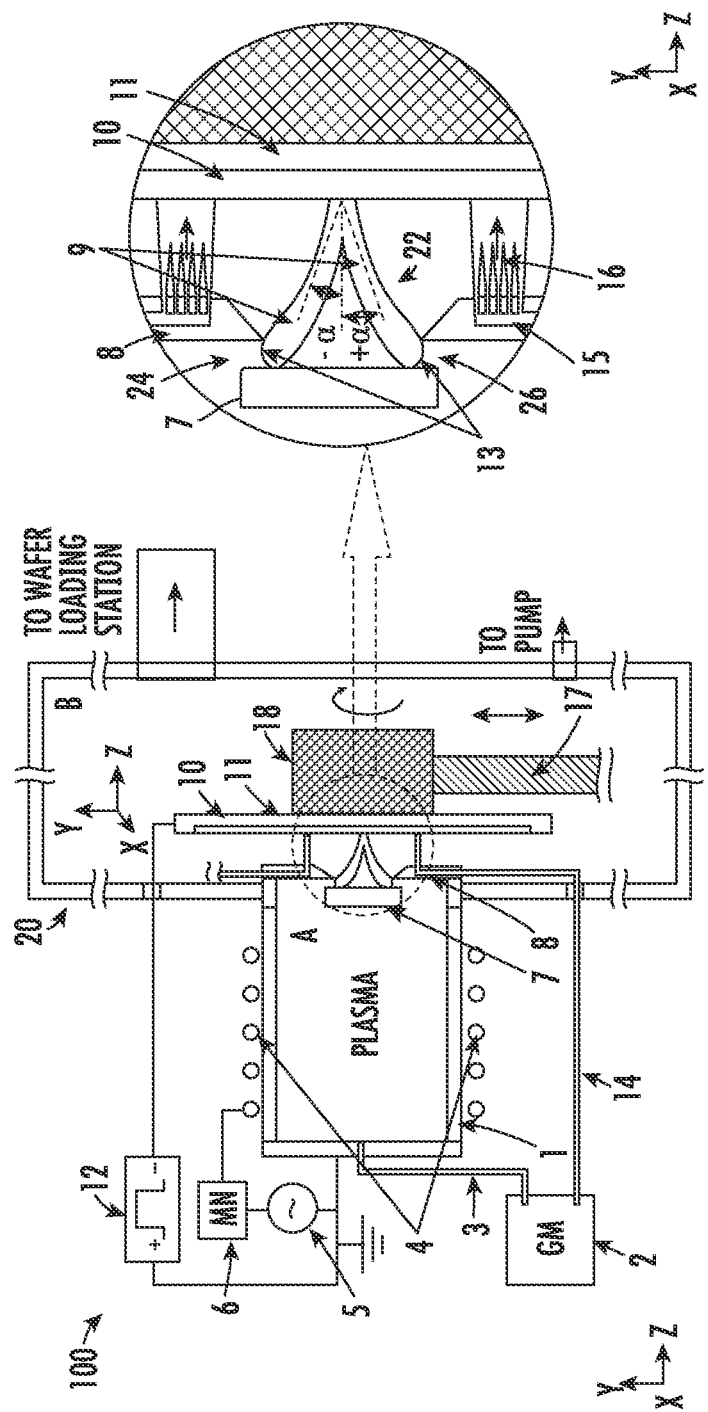
FIG. 1A depicts an embodiment of an apparatus.
FIG. 1B depicts an enlarged view of an exemplary extraction assembly.

The present embodiments will now be described more fully hereinafter with reference to the accompanying drawings, in which some embodiments are shown. The subject matter of the present disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

The embodiments described herein provide apparatus, systems, and methods for controlling angular distribution of ions directed to a substrate using an ion optics arrangement comprising of a beam blocker—extraction plate assembly. In particular, the present embodiments provide a novel extraction system to generate ion beams from a plasma at controlled low angle of incidence and small "angular spread." The reference to "angle of incidence" herein may refer to the mean angle of incidence of ions in an ion beam with respect to a reference direction such a perpendicular to a substrate, while the term "angular spread" may refer to the width of distribution or range of angles of incidence centered around the mean angle.

As detailed below, novel ion beam apparatus are disclosed where the angle of incidence of ion beams is controlled paradoxically using an extraction system to block the plasma in a plasma chamber from any normal (perpendicular) line of sight with respect to a substrate to be processed. As a result, the beam current of extracted ion beams may be reduced, with a previously unrealized benefit that low angle ion beams may be generated having a low angular spread. For plasma processing of high aspect ratio device structures, the provided apparatus, systems, and methods provides the benefit of having ion beams that may properly treat targeted surfaces, such as sidewalls, of these structures, without affecting other surfaces.

FIG. 1A depicts an embodiment of an apparatus 100, according to embodiments of the disclosure. FIG. 1B depicts an enlarged view of an exemplary extraction assembly. The apparatus 100 includes a plasma chamber 1, in which chamber inductively coupled plasma (ICP) is generated by an rf power source 5, matching network 6, and RF antenna 4. The plasma chamber 1 may receive gaseous species through manifold 2 and operation gas line 3. To generate angled ion beams an extraction assembly is provided, including a beam blocker 7 and an extraction plate 8. In some embodiments, the plasma chamber 1, as well as beam blocker 7 and extraction plate 8 may be formed of dielectric material (e.g., alumina, quartz, aluminum nitride).

A process chamber 20 is disposed adjacent to the plasma chamber 1. Positive ions may be extracted from the plasma chamber 1 by keeping the plasma chamber at ground potential and applying a negative bias using bias source 12 to a substrate 10 and substrate holder 11, disposed in the process chamber 20. Different than known plasma processing tools, where the on-wafer ion incidence angle is zero (with respect to a perpendicular (z-axis) to a main plane (x-y plane) of a substrate), in the present embodiment, beamlets of ions strike the substrate 10 surface at non-zero angles of incidence. For example, in various non-limiting embodiments, these non-zero angles of incidence may be symmetrically disposed about zero degrees at $-\alpha$ and $+\alpha$. The magnitude of these angles is a function of plasma density and extraction voltage (negative bias voltage applied on substrate).

In some embodiments an additional gas injection line 14 may be provided, connected to gas shower heads 15 to generate a gas stream 16. To provide various types of motion to the substrate 10, a vertical motion stage 17 and rotational motion stage 18 may be provided.

Figure 1C:
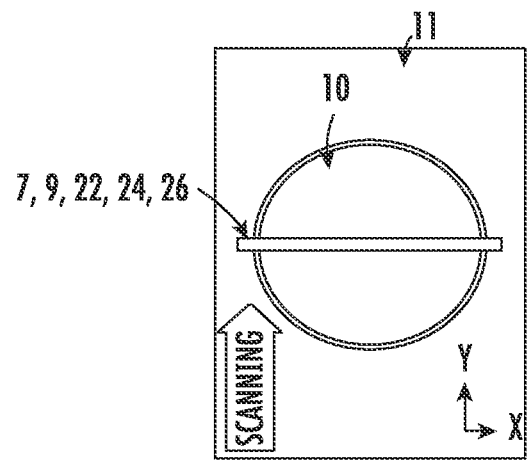
FIG. 1C depicts a front view of geometry of a substrate and substrate holder with respect to an extraction assembly, according to embodiments of the disclosure.

The extraction plate 8 defines an extraction aperture 22, where the beam blocker 7 is located proximate to the extraction aperture 22, so as to define a first extraction slit 24 and second extraction slit 26. A first plasma meniscus and a second plasma meniscus are shown as plasma menisci 13, which menisci form in each of the two extraction slits, first extraction slit 24 and second extraction slit 26 (see FIG. 1B). An ion beam 9, shown as two separate beamlets, is extracted through the first extraction slit 24 and the second extraction slit 26. During processing, the substrate 10 may be scanned up and down (along the y-axis) in front of the two extraction slits by the vertical motion stage 17. As shown in FIG. 1C, the extraction aperture 22, beam blocker 7, and therefore, first extraction slit 24 and second extraction slit 26 may be elongated along the x-direction so as to extend beyond an entirety of the width of substrate 10. In this fashion, an entirety of the substrate surface of substrate 10 may be exposed to the ion beam 9 during scanning along the y-axis. For a given scanning speed, the number of scans is determined based on required ion dose and available ion beam current.

For purposes of explanation, for a scanning speed of the substrate of 10 cm/s and an ion beam height of 30 mm along the y-axis, the time spent by any substrate surface under ion bombardment is 300 milliseconds. In the case where the ion beam 9 is extracted as a pulsed ion beam at a pulsing frequency of 40 kHz and a duty cycle of 50%, the substrate surface is exposed to approximatively 6,000 cycles of ion bombardment while passing in front of the extraction aperture. Under these conditions the processing yield of a substrate may (etching rate for instance) be a complex function of ion energy, ion flux, incidence angle, and the nature of the material to be processed by ion beam 9. High process uniformity may be accomplished with the rotational motion stage 18, which stage allows wafer rotation in increments of 0.1° over a full 360°.

Figure 1D:
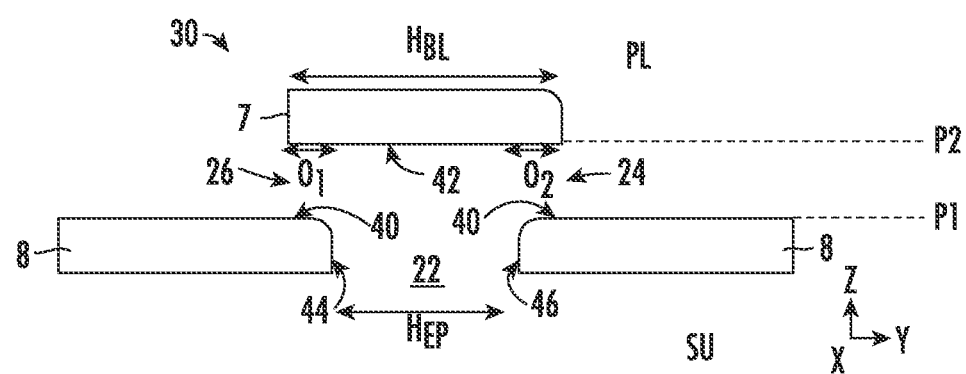
FIG. 1D shows details of an extraction assembly, in accordance with embodiments of the disclosure

Turning now to FIG. 1D, further details of an extraction assembly 30 are shown, in accordance with embodiments of the disclosure. In this embodiment, the extraction plate 8 is provided as an electrically insulating, dielectric material, having an extraction aperture 22, as shown. The extraction aperture 22 may be elongated along a first direction, meaning the x-direction in the Cartesian coordinate system shown. The extraction aperture 22 is characterized by an aperture height, sown as $H_{EP}$, extending along a second direction, perpendicular to the first direction (meaning along the y-direction). The extraction plate 8 defines an inner surface 40 along the extraction aperture 22, lying in a first plane P1. The beam blocker 7 has an outer surface 42, disposed in a second plane P2, different than the first plane P1 but parallel to it, toward an inner side of the extraction plate 8.

As further shown in FIG. 1D, the beam blocker 7 is characterized by a beam blocker height, shown as $H_{BL}$, and is arranged to overlap by a first overlap distance O1 with the extraction plate 8, along a first edge 44 of the extraction aperture 22, and overlaps by a second overlap distance O2 with the extraction plate 8 along a second edge 46 of the extraction aperture 22. By virtue of these overlap distances, there is no vertical (along the Z-direction) line of sight between a plasma side PL of the extraction assembly 30 and a substrate side SU of the extraction assembly. This configuration differs from the configurations of known extraction assemblies, where a beam blocker is provided in the middle of an extraction aperture so as to facilitate extraction of sufficient beam current from a plasma. However, the present inventors have discovered that the configuration of FIG. 1D may provide special beam properties, as discussed below.

To illustrate the effect of the architecture of FIGS. 1A-1D, FIGS. 2A-2C present simulations of electrostatic equipotential lines and ion trajectories for three different variants of embodiments of the disclosure. In particular, in the simulations shown, the beam blocker 7 has a rectangular cross-section with the following dimensions: 5 mm thickness along the z-direction, and a height $h_{BL}$. The beam blocker may extend along x direction (perpendicular to the plane of the figure) for 450 mm. Adjacent to the beam blocker 7 is the extraction plate 8, which component also forms one of the plasma chamber 200 walls. The extraction plate 8 has a rectangular aperture extending along the x direction for 420 mm and has a height along the y-axis $h_{EP}$. For purposes of explanation, in FIG. 2A, the beam blocker 7 and the extraction plate 8 have equal heights $h_{BL}=h_{EP}$ and are aligned in such a fashion the beam blocker 7 overlaps perfectly the extraction aperture 22. Because the beam blocker 7 outer surface 42 is recessed 4 mm from the inner surface 40 of the extraction plate 8, the blocker-extraction plate assembly forms two identical slits (13b) through which slits the beamlets (shown as ion beam 9) are extracted. The beam blocker 7 and the extraction plate 8 are made of dielectric material (alumina is used in this simulation) which material forms the bulk of these components, and in practical implementations may be coated with a thin protecting film (also dielectric) to withstand the harsh chemically reactive environment in a given plasma chamber.

From electrostatic point of view, the dielectric material of the beam blocker 7 and extraction plate 8 is transparent to the electric field lines, which transparency means the electric field lines will penetrate the extraction plate 8 and will protrude into the plasma in plasma chamber 200. The characteristics of the trajectories of ions emerging through the slits 13b are dictated by the shape and location of a plasma menisci forming the boundary between the plasma and vacuum, to the right of the extraction assembly. The meniscus formation is a result of the balance between the "plasma pressure" which pressure tries to push the plasma outside the slits 13b and the "electrostatic pressure" which pressure tries to push the plasma inside the slits 13b. These two antagonistic actions are quantified by the plasma density for the former and the electrostatic field for the latter. Mathematically, this condition is expressed as the balance between Bohm current at the plasma sheath edge $$j_{Bohm}=en_s v_{Bohm} \quad (1)$$

where e stands for elementary charge, $n_s$ is plasma density at the sheath edge ($n_s=0.61n_0$, $n_0$—the bulk plasma density), and $v_{Bohm}=(k_B T_e/m_i)^{1/2}$ is the Bohm velocity with $k_B$, $T_e$, and $m_i$ referring to Boltzmann constant, electron temperature, and ion mass, respectively. The Child-Langmuir space charge limited current is given by $$j_{C-L} = \frac{4\varepsilon_0}{9}\left(\frac{2e}{m_i}\right)^{\frac{1}{2}}\frac{V_e^{\frac{3}{2}}}{z^2} \quad (2)$$

with $\varepsilon_0$ being the dielectric constant of the free space, $V_e$ being the extraction voltage, and z being the extraction gap length (slit to wafer distance).

Under these conditions, when the beam blocker height $h_{BL}$ (along the y-direction) relative to the extraction plate height $h_{EP}$ along the y-direction is increased, the plasma meniscus moves deeper inside the plasma and becomes more concave. The relative overlap of the beam blocker 7 and extraction plate is expressed in FIGS. 2A-2C as a parameter $\Delta y$. As shown in the progression between FIGS. 2A, 2B, and 2C, between respective values of 0 mm to 1 mm to 2 mm for $\Delta y$, the extracted beam current is substantially reduced as the meniscus recedes inside the plasma, and there is no vertical line of sight between plasma chamber 200 and process chamber 204. In addition, the beam mean angle of incidence with respect to perpendicular (z-axis) to the main plane (x-y) of the substrate 10 increases slightly.

Notably, a side effect of this geometry change where an overlap of the beam blocker 7 and extraction plate 8 is created, is that the beam angular spread decreases significantly, as detailed below. In other words, the trajectories of the ions of the beamlets that form the ion beam 9 are incident on the substrate 10 over a much narrower range of angles of incidence.

Figure 3A:
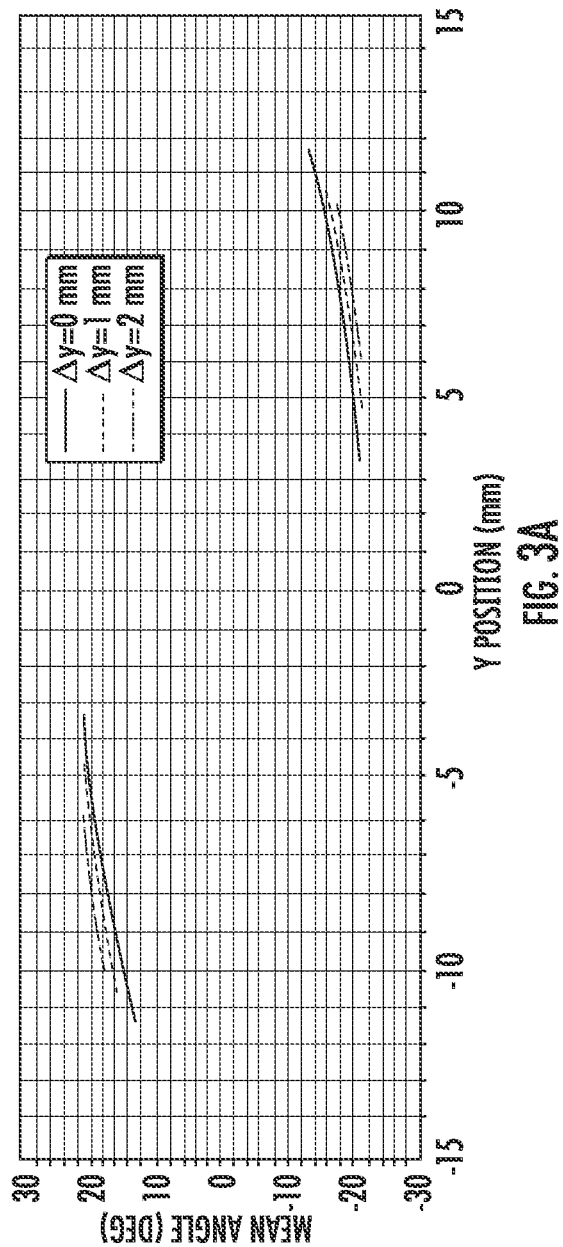
FIG. 3A and FIG. 3B present emissivity curves and angular distributions, respectively, for the three different variants of embodiments shown in FIGS. 2A-2C.
Figure 3B:
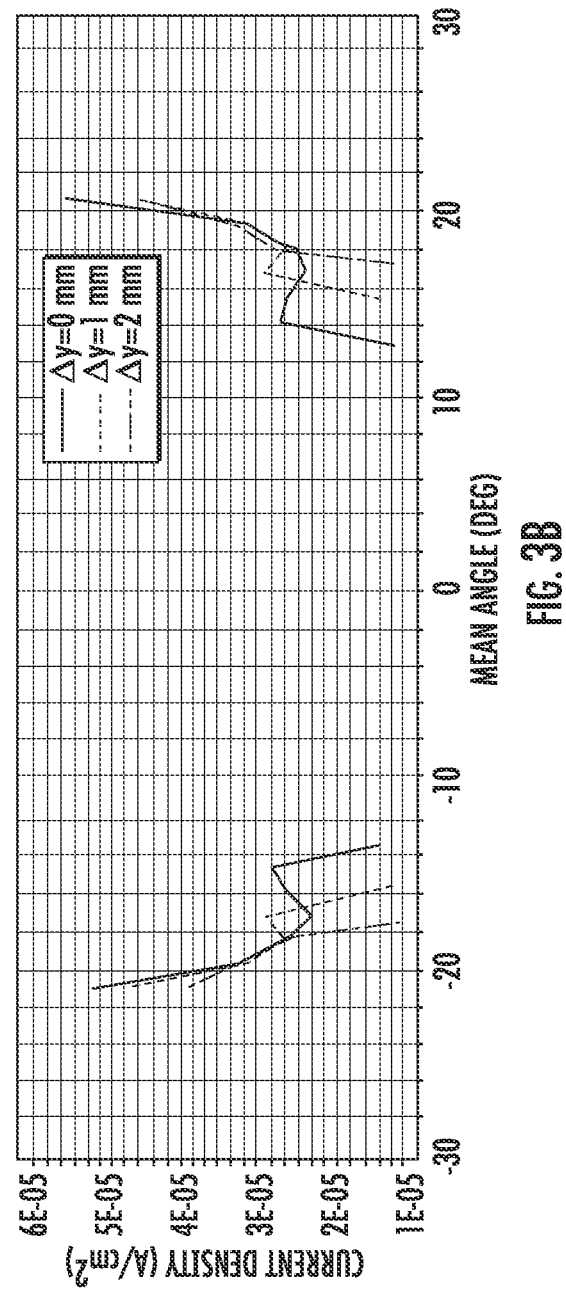

FIG. 3A and FIG. 3B depict the results of OPERA modelling of the emissivity curves for three geometries depicted in FIGS. 2A-2C, using ion source "average" operating parameters for a plasma chamber (ion source), meaning in the of middle of an operation range: $V_e = 1$ kV, $z_{gap} = 10$ mm (see FIG. 2C), and P=600 W. FIG. 3A plots mean angle of incidence as a function of position on a substrate for three different ion extraction geometries, with $\Delta y$ varying as shown. The mean angle is plotted in absolute terms with respect to the z-axis (zero degrees), so that the two different beamlets (which beamlets together define the ion beam 9) define either a positive or a negative angle of incidence with respect to perpendicular (z-axis). At the positions between approximately 4 mm and 12 mm (+ or −) where ion impact occurs, the mean angle is slightly higher when the overlap of beam blocker 7 and extraction plate 8 is 2 mm for $\Delta y$, such as increasing by 2-3 degrees average angle of incidence with respect to beam blocker 7 and extraction plate 8 overlap of 0 mm for $\Delta y$.

FIG. 3B plots current density as a function of mean angle for the same three different ion extraction geometries, with $\Delta y$ varying as shown. As with FIG. 3A, the results reflect the effect of two different beamlets, symmetrically disposed about zero degrees (z-axis). As shown, beam current is distributed over a wider range of angles for $\Delta y = 0$ mm than for cases where overlap is 1 mm or 2 mm. More quantitatively, the beam angular spread (BAS) decreases from 10° to 6° as $\Delta y$ increases from 0 mm to 2 mm.

Further to the results of FIGS. 3A-3B, FIG. 3C, FIG. 3D and FIG. 3E depict the results of current measurement as a function of beam angle for values of $\Delta y$ of 0 mm, 1 mm, or 2 mm (schematic depictions of the extraction geometry are shown to the left in the figures). The experimental results depicted in FIG. 3C, FIG. 3D and FIG. 3E are based upon a plasma generated by flowing a mixture of $Ar/CF_4$ at a ratio of 20 sccm/10 sccm into a plasma chamber, and extracting an ion beam through a given extraction assembly at a bias of 2.25 kV. The distance between extraction plate and substrate (z-gap) in these experiments was held constant at 30 mm. The extraction aperture height along the y-axis as constant in these experiments at 30 mm. Thus, the different values of $\Delta y$ were set by selection of different beam blocker heights, from 30 mm to 32 mm to 34 mm. Note that the beam blocker is placed symmetrically over the extraction aperture in these examples, so that the value of $\Delta y$ is determined as (beam blocker height−extraction aperture height)/2. Thus, the combination of a 34 mm beam blocker and 30 mm extraction aperture yields a $\Delta y$ value of 2 mm.

As shown in the graphs, the beam angular spread at $\Delta y$ value of 2 mm (FIG. 3E) is substantially narrower than the beam angular spread at $\Delta y$ value of 0 mm (FIG. 3C). More quantitatively, the beam angular spread (BAS) decreases from 13.4° at zero mm $\Delta y$ to 9.4° at $\Delta y$ equals 2 mm, while the average beam angle increases from 13.6° to 17.7°. Also, the tail of significant ion current toward very low angles, less than five degrees, shown in FIG. 3C for $\Delta y$ value of 0 mm, is eliminated for $\Delta y$ equal to 2 mm.

Figure 4A:
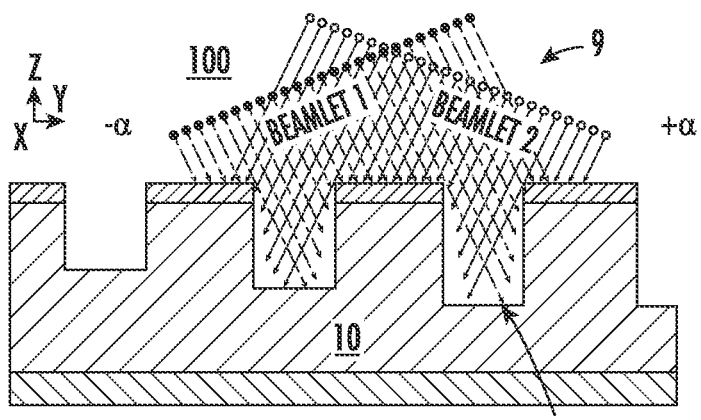
FIG. 4A shows one implementation of an apparatus for processing a substrate.

The significance of these differences is highlighted below with respect to FIG. 4A-4C. Turning to FIG. 4A, there is shown one implementation of the apparatus 100 for processing a substrate 10. In this example, the ion beam 9 is directed as two beamlets to the substrate at trajectories having a mean angle of $+\alpha$ or $-\alpha$ with respect to the z-axis. The substrate 10 includes pattern features having sidewalls SWL. As such, the ion beam 9 may impact various portions of these features, including the sidewalls SWL. When arranged as an array, these features also define trenches that have a sidewall SWL and bottom surface B. Depending upon the magnitude of a and the aspect ratio of these trenches, the ion beam 9 may or may not impact the bottom surface B.

In one example where an angled ion beam is used to generate trench elongation along the y direction, the ion beam 9 is designed to perform etching of the sidewalls SWL of a trench. In some device structures having trench features, the aspect ratio may be as high as ~4.5:1 or more. Using the example of 4.5:1 aspect ratio, this geometry defines an acceptance beam angle of ~13°, meaning that an ion beam having an angle of incidence higher than 13 degrees will not fully impact the sidewalls SWL, since lower portions of the sidewalls SWL will be shadowed by the top of the trench features (for example, a hardmask). Thus, a relatively low angle of incidence is called for in these applications for etching sidewalls of high aspect ratio trenches. In addition, etching of the vertical wall (SWL) is to be performed without any recess of the bottom surface B. In order to accomplish these dual goals, a well-tailored, low angle ion beam having a low beam angular spread is called for. FIG. 4B presents an example of a well-tailored beam ion angular distribution (IAD) to meet the above requirements for the given trench feature pictured (for clarity just one of the two symmetric beamlets is sketched). The mean angle of the ion beamlet is shown as $\alpha$, with a beam angular spread of $\Delta\alpha$. In this case, the ion flux impinges over a range of angles such that ions strike the side wall SWL, from top to bottom, while not impinging on lower surface B. Thus, because the tops of the features are made of etching resistant materials (hardmask), etching takes place along the sidewalls SWL, while no etching takes place along the bottom surface B.

Figures 4B, 4C:
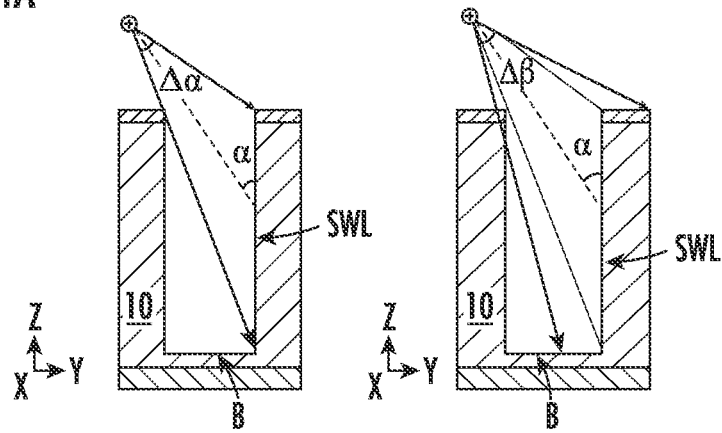
FIG. 4B presents an example of a well-tailored beam ion angular distribution (IAD)
FIG. 4C depicts a less well tailored beam; having the same mean angle as shown in FIG. 4B.

Conversely, FIG. 4C depicts a less well tailored beam; having the same mean angle (again shown as $\alpha$), with a wider angular spread (shown as $\Delta\beta$). The portion of the IAD representing ions having trajectories below a given minimal angle (shown in the shaded portion) reach the lower surface B of the trench, while ions having trajectories above a maximum angle likewise will tend to cause undue etching of top surfaces. Accordingly, the above example demonstrates the usefulness of providing a narrow ion angular distribution, including for low mean angles of incidence, where small deviations in incidence angle may negatively impact a substrate treatment process, by impinging upon unwanted regions.

Figure 5A:
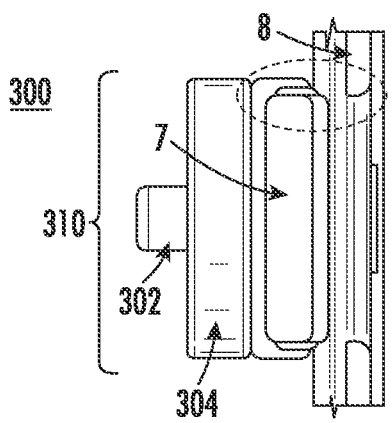
FIG. 5A depicts an extraction assembly, according to additional embodiments of the disclosure.
Figure 5B:
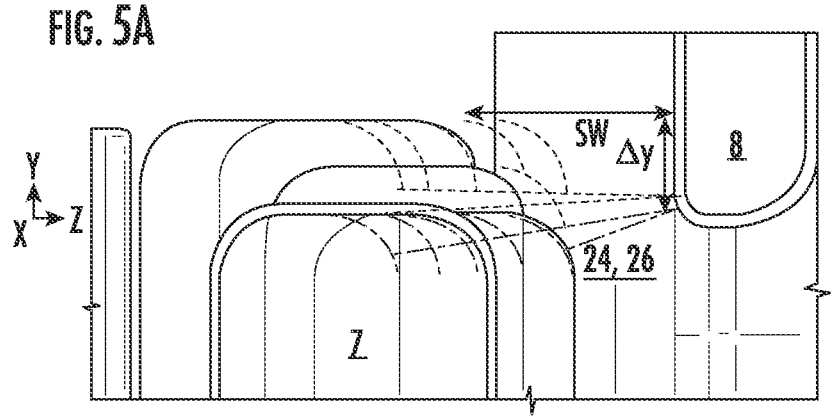
FIG. 5B shows a detailed view of the extraction assembly of FIG. 5A.

FIG. 5A depicts an extraction assembly 300, according to additional embodiments of the disclosure. In addition to the extraction plate 8, the extraction assembly 300 includes a coupling assembly 310, used to couple a beam blocker to the extraction plate 8, where the beam blocker is generally shown as beam blocker 7. The coupling assembly 310 includes a mounting pin 302 and screening washer 304, where these components are used to connect the beam blocker 7 to extraction plate 8. As detailed with respect to 6A-6C to follow, the coupling assembly 310 provides flexibility in terms of placement of the beam blocker 7 with respect to extraction plate 8 and thus with respect to extraction aperture 22. As shown in the detailed view of FIG. 5B, this flexibility allows the independent adjustment of overlap Δy as well as the magnitude of the extraction slits 24, 26, shown as a slit width or sw.

Figure 6A:
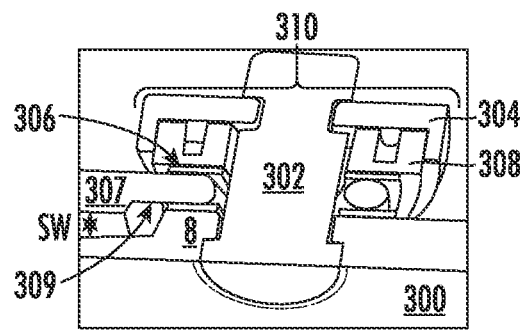
FIGS. 6A-6F show three different configurations of an extraction assembly, according to embodiments of the disclosure.
Figure 6B:
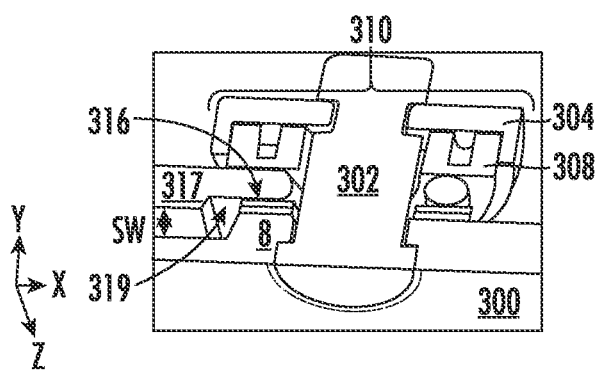
Figure 6C:
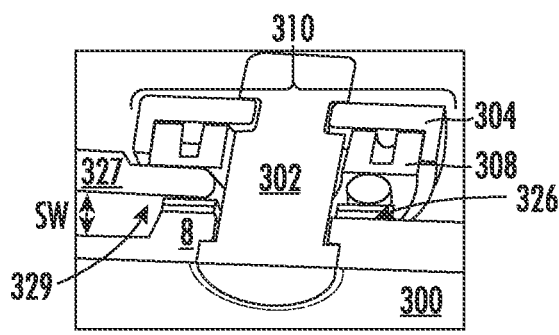
Figure 6D:
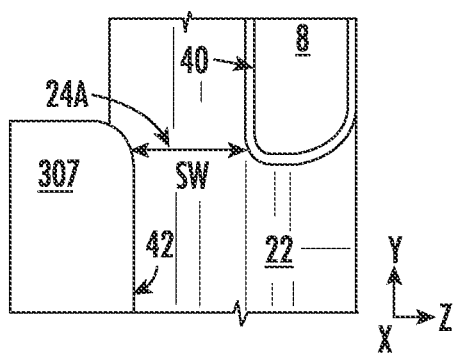
Figure 6E:
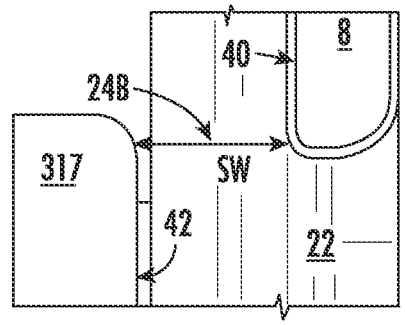
Figure 6F:
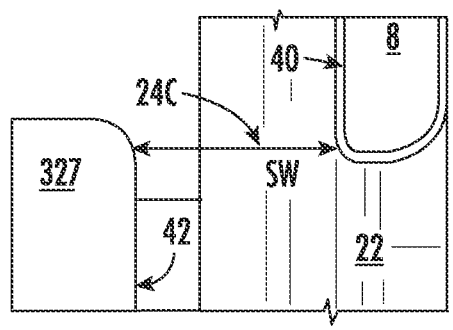
Figure 6G:
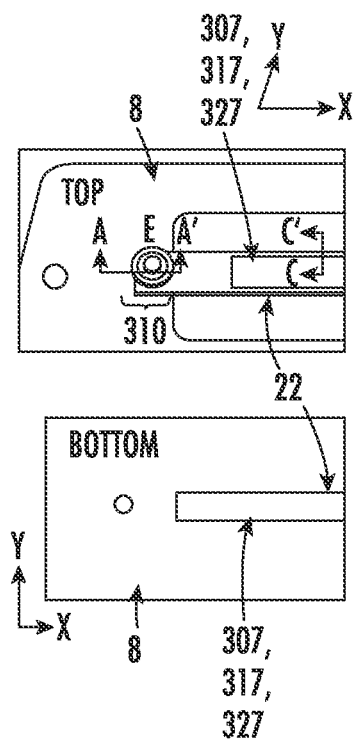
FIG. 6G shows back and front views of the extraction plate—beam blocker assembly.
Figures 7A, 7B:
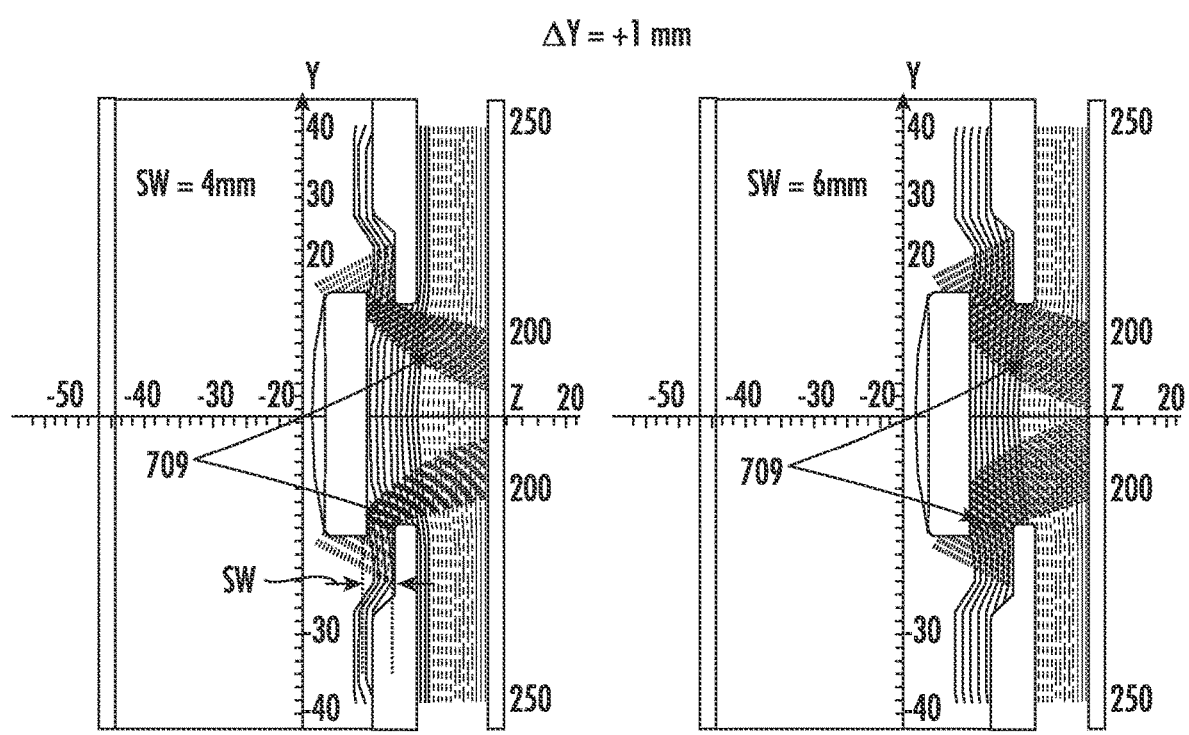
FIGS. 7A-7D present simulations of electrostatic equipotential lines and ion trajectories for four different variants of embodiments of the disclosure.
Figures 7C, 7D:
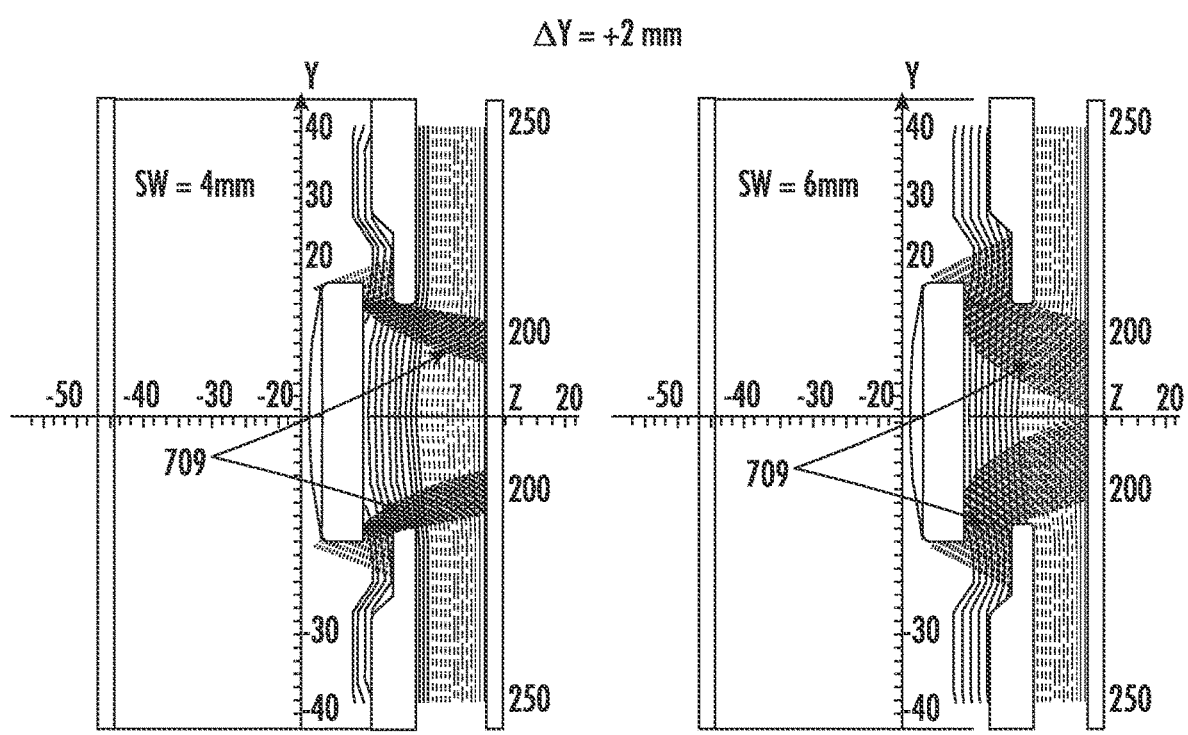

Turning now to FIGS. 6A-6C there are shown three different configurations of the extraction assembly 300. In particular, a perspective cross-section is shown where the main section is along the x-z plane. In particular the view of the x-z plane is along the section A-A' located near end portion E of the extraction aperture 22, in the middle of the beam blocker-extraction plate assembly, as represented in the top view of FIG. 6G. In FIGS. 6D-6F there is a cross-section of the extraction plate 8 and beam blockers in the region of the extraction aperture 22, corresponding to respective FIGS. 6A-6C, as shown along the y-z plane, and represented in the section C-C' in FIG. 6G.

As illustrated in FIG. 6A, the coupling assembly 310 includes the screening washer 304 and mounting pin 302, as well as lock washer 308. In the configuration of FIG. 6A, a variant of the beam blocker 7 is provided, shown as beam blocker 307. The beam blocker 307 includes a ridge 309, which ridge may be deemed a first ridge. Likewise, a second ridge may be located on the beam blocker 307 at an opposite end of the beam blocker 307 (along the x-direction). The coupling assembly 310 further includes a shim assembly 306, which assembly may include one or more spacers or shims. As shown in FIG. 6A, a single shim of the shim assembly 306 is located between the ridge 309 and extraction plate 8. The placement of one or more shims or spacers between the extraction plate 8 and ridge 309 facilitates changing the distance or sw between the outer surface 42 of the beam blocker 307 and the inner surface 40 of the extraction plate 8, as shown in FIG. 6D. In one example of FIG. 6D, the extraction aperture 22 may have a height along the y-axis of 30 mm, while the beam blocker 307 has a height of 32 mm, providing for a symmetrical overlap of 1 mm of the beam blocker 307 and extraction plate 8, along each edge of the extraction aperture 22. In one implementation where a spacer of the shim assembly 306 has a thickness of 1 mm, the resultant slit width, shown as sw, of the extraction slit 24A may be 3.17 mm.

As illustrated in FIG. 6B, the coupling assembly 310 may be used to connect another variant of beam blocker 7 to extraction plate 8, in this case shown as the beam blocker 317. The beam blocker 317 also includes a ridge 319, which ridge may be deemed a first ridge. Likewise, a second ridge may be located on the beam blocker 317 at an opposite end of the beam blocker 317 (along the x-direction). The coupling assembly 310 further includes a shim assembly 316, which assembly includes two spacers located between the ridge 319 and extraction plate 8.

The placement of two shims or spacers between the extraction plate 8 and ridge 319 facilitates further increasing the slit width distance or sw between the outer surface 42 of the beam blocker 317 and the inner surface 40 of the extraction plate 8, as shown in FIG. 6E. In one example of FIG. 6E, the extraction aperture 22 may have a height along the y-axis of 30 mm, while the beam blocker 317 has a height of 34 mm, providing for a symmetrical overlap of 2 mm of the beam blocker 317 and extraction plate 8, along each edge of the extraction aperture 22. In one implementation where a spacer of the shim assembly 306 has a thickness of 1 mm, the resultant sw of the extraction slit 24B may be 4.09 mm.

As illustrated in FIG. 6C, the coupling assembly 310 may be used to connect another variant of beam blocker 7 to extraction plate 8, in this case shown as the beam blocker 327. The beam blocker 327 also includes a ridge 329, which ridge may be deemed a first ridge. Likewise, a second ridge may be located on the beam blocker 327 at an opposite end of the beam blocker 317 (along the x-direction). The coupling assembly 310 further includes a shim assembly 326, which assembly includes two spacers located between the beam blocker 327 and extraction plate 8. In this example, the ridge 329 is a "reverse" ridge, in that the ridge 329 is located on an upper surface of the beam blocker 327, away from the extraction plate 8. Thus, the outer surface 42 of the beam blocker 327 is spaced further away from the inner surface 40 of extraction plate 8, as shown in FIG. 6F.

In one example of FIG. 6F, the extraction aperture 22 may have a height along the y-axis of 30 mm, while the beam blocker 327 has a height of 34 mm, providing for a symmetrical overlap of 2 mm of the beam blocker 327 and extraction plate 8, along each edge of the extraction aperture 22. In one implementation where a spacer of the shim assembly 306 has a thickness of 1 mm, the resultant sw of the extraction slit 24B may be 5.77 mm. The above examples of Δy and sw are merely exemplary, and any suitable additional combination may be readily provided by the coupling assembly 310. Moreover, while these examples are provide in terms of mm dimensions, according to various embodiments, the overlap Δy may expressed in terms of the slit width of an extraction aperture, namely the ratio of overlap on both edges of the extraction aperture to extraction slit width (sw) may range from approximately 0.1 to 1.0.

Thus, the coupling assembly 310 provides a flexible way to modify the degree of overlap (Δy) between a beam blocker and extraction plate, as well as the slit width or gap between beam blocker and extraction plate along the z-direction. Advantages of this flexibility are further illustrated with respect to FIGS. 7A-7D.

Similar to the simulations of FIGS. 2A-2C the FIGS. 7A-7D present simulations of electrostatic equipotential lines and ion trajectories for four different variants of embodiments of the disclosure. In particular the modelling results shown in these figures illustrate the ion beam shape for two different beam blocker heights, yielding values of Δy=1 mm and Δy=2 mm, and two different slit widths of sw=4 mm and sw=6 mm. The results of these simulations show that increasing beam blocker height translates into lower beam current. This result is not unexpected since, as noted previously, in known configurations of extraction assemblies, the beam blocker does not overlap with an extraction plate, so that sufficient beam current from being extracted from a plasma. Also shown in these figures, increasing the slit width leads to larger on-wafer beam footprint and implicitly larger beam current. Thus, the coupling assembly 310, by readily coupling different configurations of beam blockers and shim assemblies to an extraction plate, facilitates the ability to independently adjust the overlap of beam blocker and extraction plate, in order to narrow beam angular spread, and to independently adjust slit width, to increase or decrease the amount of extractable beam current for a given overlap.

As can be seen in Table I, for an elevation Δy=2 mm, the extracted ion beam current for a 6 mm slit with will provide a beam current of 3.88 mA which value is 17.5% more than the value of beam current for a 4 mm slit width where $\Delta y=0$ mm.

TABLE I

Extracted ion beam current (in mA) for different extraction slit widths (SW) and different overlap between beam blocker and extraction plate (blocker elevation) ($\Delta y$)

| Slit width/<br>Blocker overlap | $\Delta y$= 0 mm | $\Delta y$= +1 mm | $\Delta y$= +2 mm | $\Delta y$= +3 mm |
|---|---|---|---|---|
| SW = 4 mm | 3.30 | 2.36 | 1.58 | 0.98 |
| SW = 6 mm | 7.42 | 5.35 | 3.88 | 2.97 |

According to the present disclosure, the various embodiments may provide the following advantages. As a first advantage, the present embodiments provide the advantage of being able to etch high aspect ratio holes where a low incidence angle and a low angular spread are called for to properly etch targeted surfaces of the holes. As a second advantage, embodiments of the disclosure provide facile adjustability of extracted beam current, independently from the amount of overlap between extraction plate and beam blocker, to maintain acceptable levels of beam current for ion beams having low angular spread.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. An extraction assembly, comprising:
an extraction plate for placement along a side of a plasma chamber, the extraction plate having an extraction aperture, elongated along a first direction, and having an extraction aperture height, extending along a second direction, perpendicular to the first direction, the extraction plate defining an inner surface along the extraction aperture, lying in a first plane;
a beam blocker, disposed over the extraction aperture, and having an outer surface, disposed in a second plane, different than the first plane, toward an inner side of the extraction plate,
wherein the beam blocker overlaps with the extraction plate along a first edge of the extraction aperture by a first overlap distance, and overlaps with the extraction plate along a second edge of the extraction aperture by a second overlap distance, so as to define a first extraction slit, along the first edge, and a second extraction slit along the second edge,
wherein the beam blocker comprises a first ridge, disposed along a first end of the beam blocker, and a second ridge, disposed along a second end of the beam blocker; and
a spacer assembly, the spacer assembly comprising a first set, disposed between the extraction plate and the first ridge, and further comprising a second set, disposed between the extraction plate and the second ridge.

2. The extraction assembly of claim 1, wherein the extraction plate and the beam blocker comprise a dielectric material.

3. The extraction assembly of claim 1, wherein the first plane and the second plane define an extraction slit width for the first extraction slit and the second extraction slit, the extraction slit width being a separation distance between the first plane and the second plane along a perpendicular to the first plane and the second plane.

4. The extraction assembly of claim 3, wherein the first overlap distance and the second overlap distance equal 10% to 100% of the extraction slit width.

5. The extraction assembly of claim 4, wherein the extraction slit width is equal to 5% to 40% of the extraction aperture height.

6. The extraction assembly of claim 1, wherein the extraction plate and the beam blocker are interoperative to extract a first ion beamlet from the first extraction slit and a second ion beamlet from the second extraction slit, wherein the first ion beamlet and the second ion beamlet generate a beam angular spread of less than 10 degrees.

7. The extraction assembly of claim 6, wherein the first ion beamlet from the first extraction slit and the second ion beamlet define an beam mean angle of less than 20 degrees with respect to a perpendicular to the first plane and the second plane.

8. A processing apparatus, comprising:
a plasma chamber to house a plasma;
an extraction plate arranged along a side of a plasma chamber, the extraction plate having an extraction aperture, elongated along a first direction, and having an extraction aperture height, extending along a second direction, perpendicular to the first direction, the extraction plate defining an inner surface along the extraction aperture, lying in a first plane;
a beam blocker, disposed over the extraction aperture, and having an outer surface, disposed in a second plane, different than the first plane, toward an inner side of the extraction plate,
wherein the beam blocker overlaps with the extraction plate along a first edge of the extraction aperture by a first overlap distance, and overlaps with the extraction plate along a second edge of the extraction aperture by a second overlap distance, so as to define a first extraction slit, along the first edge, and a second extraction slit along the second edge,
wherein the beam blocker comprises a first ridge, disposed along a first end of the beam blocker, and a second ridge, disposed along a second end of the beam blocker; and
a spacer assembly, the spacer assembly comprising a first set, disposed between the extraction plate and the first ridge, and further comprising a second set, disposed between the extraction plate and the second ridge.

9. The processing apparatus of claim 8, wherein the extraction plate and the beam blocker comprise a dielectric material.

10. The processing apparatus of claim 8, wherein the first plane and the second plane define an extraction slit width for the first extraction slit and the second extraction slit, the extraction slit width being a separation distance between the first plane and the second plane along a perpendicular to the first plane and the second plane.

11. The processing apparatus of claim 10, wherein the first overlap distance and the second overlap distance equal 10% to 100% of the extraction slit width.

12. The processing apparatus of claim 10, wherein the extraction slit width is equal to 5% to 40% of the extraction aperture height.

13. The processing apparatus of claim 8, wherein the extraction plate and the beam blocker are interoperative to extract a first ion beamlet from the first extraction slit and a second ion beamlet from the second extraction slit, wherein the first ion beamlet and the second ion beamlet generate a beam angular spread of less than 10 degrees.

14. The processing apparatus of claim 13, wherein the first ion beamlet from the first extraction slit and the second ion beamlet define an beam mean angle of less than 20 degrees with respect to a perpendicular to the first plane and the second plane.

15. A compact angled ion beam apparatus, comprising:
a plasma chamber to house a plasma; and
an extraction assembly, disposed adjacent to the plasma chamber, and comprising:
an extraction plate arranged along a side of a plasma chamber, the extraction plate having an extraction aperture, elongated along a first direction, and having an aperture height, extending along a second direction, perpendicular to the first direction, the extraction plate defining an inner surface along the extraction aperture, lying in a first plane;
a beam blocker, disposed over the extraction aperture, and having an outer surface, disposed in a second plane, different than the first plane, toward an inner side of the extraction plate; and
a coupling assembly, reversibly connecting the beam blocker to the extraction plate,
wherein the coupling assembly is configured to adjust an overlap distance between the extraction plate and the beam blocker along the second direction, and to adjust a slit width of the extraction assembly, the slit width comprising a distance between the extraction plate and beam blocker along a third direction, perpendicular to the first plane and the second plane.

16. The compact angled ion beam apparatus of claim 15, the beam blocker comprising:
a first ridge, disposed along a first end of the beam blocker, and a second ridge, disposed along a second end of the beam blocker; and
a shim assembly, the shim assembly comprising a first set, disposed between the extraction plate and the first ridge, and further comprising a second set, disposed between the extraction plate and the second ridge.

* * * * *